(12) United States Patent
Kuo et al.

(10) Patent No.: US 10,171,089 B2
(45) Date of Patent: Jan. 1, 2019

(54) PVT-FREE CALIBRATION FUNCTION USING A DOUBLER CIRCUIT FOR TDC RESOLUTION IN ADPLL APPLICATIONS

(71) Applicant: Taiwan Semiconductor Manufacturing Co., Ltd., Hsin-Chu (TW)

(72) Inventors: Feng Wei Kuo, Hsinchu County (TW); Chewn-Pu Jou, Hsinchu (TW); Lan-Chou Cho, Hsinchu (TW); Huan-Neng Chen, Taichung (TW); Robert Bogdan Staszewski, Hsinchu (TW); Seyednaser Pourmousavian, Dublin (IE)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 110 days.

(21) Appl. No.: 15/354,808

(22) Filed: Nov. 17, 2016

(65) Prior Publication Data

US 2018/0138911 A1    May 17, 2018

(51) Int. Cl.

| | | |
|---|---|---|
| *H03L 7/06* | (2006.01) | |
| *H03L 1/00* | (2006.01) | |
| *H03L 7/099* | (2006.01) | |
| *H03K 5/151* | (2006.01) | |
| *H03L 7/091* | (2006.01) | |

(52) U.S. Cl.
CPC ............. *H03L 1/00* (2013.01); *H03K 5/1515* (2013.01); *H03L 7/091* (2013.01); *H03L 7/0992* (2013.01); *H03L 7/0995* (2013.01); *H03L 2207/50* (2013.01)

(58) Field of Classification Search
CPC ....... G04F 10/005; H03L 7/085; H03L 7/093; H03L 7/08
See application file for complete search history.

(56) References Cited

U.S. PATENT DOCUMENTS

| | | | |
|---|---|---|---|
| 7,746,178 B1 * | 6/2010 | Humphreys | ............ H03L 7/085 331/1 A |
| 8,368,437 B2 | 2/2013 | Huang et al. | |
| 8,456,207 B1 | 6/2013 | Kuo et al. | |
| 8,547,151 B2 | 10/2013 | Kuo et al. | |
| 8,558,728 B1 * | 10/2013 | Lemkin | ............ G01R 31/31709 341/155 |
| 8,570,082 B1 | 10/2013 | Kuo et al. | |
| 8,593,189 B1 | 11/2013 | Yen et al. | |
| 8,890,626 B2 | 11/2014 | Chen et al. | |
| 9,065,454 B2 | 6/2015 | Lin | |
| 9,112,507 B2 | 8/2015 | Chen et al. | |
| 2013/0285722 A1 | 10/2013 | Chou | |
| 2015/0162921 A1 | 6/2015 | Chen | |
| 2015/0194971 A1 | 7/2015 | Tsai | |

* cited by examiner

*Primary Examiner* — Sibin Chen
(74) *Attorney, Agent, or Firm* — Duane Morris LLP

(57) ABSTRACT

An ADPLL circuit includes a time-to-digital converter (TDC) configured to generate a signal indicative of a phase difference between a first signal and a reference signal and a doubler electrically coupled to the TDC. The doubler is configured to receive a first voltage signal and generate a second voltage signal. The second voltage signal is provided to a voltage input of the TDC. The TDC is configured to generate one or more control signals for the doubler to adjust the second voltage signal.

17 Claims, 14 Drawing Sheets

PVT-FREE CALIBRATION FUNCTION USING A DOUBLER CIRCUIT FOR TDC RESOLUTION IN ADPLL APPLICATIONS

FIELD

This disclosure relates to digital circuit design, and more specifically, to all-digital phase-locked-loop circuit design.

BACKGROUND

All-digital phase-locked-loop (ADPLL) circuits have been proposed for use in radiofrequency (RF) and other circuits. Fast frequency acquisition is crucial for phase-locked loops operation. A time-to-digital converter (TDC) is configured to provide tuning of the ADPLL. Current ADPLL circuits utilize sensors configured to detect variations in process, voltage, and temperature (collectively referred to as "PVT") during operation of the ADPLL to calibrate the TDC. Such PVT-based calibration must be designed for each specific use case and increases the cost and complexity of ADPLL circuit design in CMOS-based circuits.

Current methods using PVT-based calibration require long delay cell stages and cannot fix TDC resolution/in-band noise in frequency synthesizer applications. Further, current PVT-based calibration cannot compensate for PVT variations (such as process variations), but instead must be individually tuned for each circuit.

BRIEF DESCRIPTION OF THE DRAWINGS

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

DETAILED DESCRIPTION

This description of the exemplary embodiments is intended to be read in connection with the accompanying drawings, which are to be considered part of the entire written description. Terms concerning attachments, coupling and the like, such as "connected," "interconnected," "electrically connected," and "electrically coupled" refer to a relationship wherein structures are electrically attached or coupled to one another, either directly or indirectly through intervening circuit elements, as well as both wired or wireless attachments or relationships, unless expressly described otherwise.

In various embodiments, an all-digital phase-locked-loop (ADPLL) having a doubler configured to provide calibration of a time-to-digital converter (TDC) is disclosed. The doubler includes a control block configured to receive a TDC tuning word (TTW) from the TDC. The output of the doubler is adjusted based on the TTW. The output voltage of the doubler is provided as an input to the TDC. In some embodiments, the doubler control block generates a plurality of phase-outputs that are configured to tune a plurality of doubler circuits to maintain a predetermined voltage output.

Figure 1:
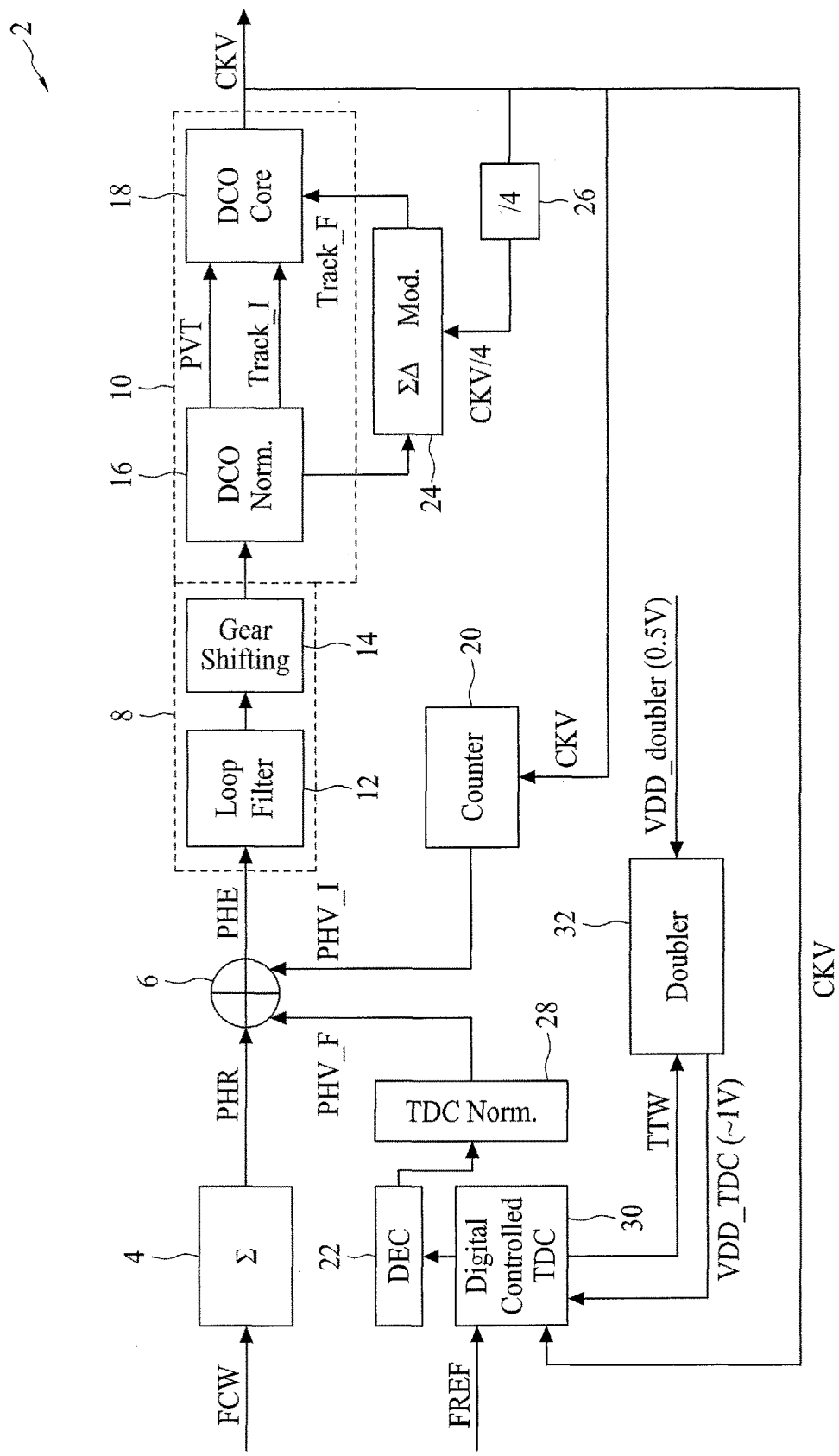
FIG. 1 illustrates an all-digital phase-locked-loop (ADPLL) having a doubler configured to provide calibration of a time-to-digital converter (TDC), in accordance with some embodiments.

FIG. 1 illustrates an all-digital phase-locked-loop (ADPLL) 2 having a doubler 32 configured to calibrate a time-to-digital converter (TDC) 30, in accordance with some embodiments. The ADPLL 2 includes a reference phase accumulator 4, a phase detector 6, a filter 8, a digitally-controlled oscillator (DCO) 10, and a digitally controlled TDC 30. The TDC 30 is configured to measure a time difference between a phase-calibrated clock signal (CKV) and a reference signal (FREF). The output of the TDC 30 is provided to the phase detector to allow for adjusting the CKV signal and tune the ADPLL 2 during operation.

In some embodiments, the reference phase accumulator 4 receives a frequency command word (FCW) input and generates a reference phase accumulation (PHR) signal by accumulating the phase of the FCW. In some embodiments, the phase of the FCW is accumulated by counting the number of phase changes in the FCW signal that occur within an active period of a clock signal, although it will be appreciated that other accumulation circuits and techniques can be used. The PHR signal is provided to a phase detector 6. The phase detector 6 receives one or more inputs, such as the PHR signal, a fractional error correction (PHVF) signal, and an edge clock transition accumulation (PHV) signal. The phase detector 6 compares the phase of one or more of the input signals to generate a phase error output (PHE) signal. The phase error output signal is provided to the filter 8.

In some embodiments, the filter 8 is configured to provide shaping of the PHE signal received from the phase detector 6. The filter 8 can include a loop filter 12 and a gear shifting circuit 14. The loop filter 12 is configured to filter the output signal (PHE) of the phase detector to control one or more operation characteristics of the ADPLL 2. For example, in some embodiments, the loop filter 12 is configured to scale the output signal (PHE) from a first bit value to a second, reduced bit value. The loop filter 12 can comprise any suitable filter, such as, for example, an infinite impulse response (IRR) filter, a digital low pass filter (DLF), a digital high pass filter (DHF), any other suitable filter, and/or any combination thereof.

In some embodiments, the filter 8 includes a gear shifting circuit 14. The gear shifting circuit 14 is operative to adjust a loop gain of the ADPLL 2. The loop gain can be increased and/or decreased to increase and/or decrease the bandwidth of the ADPLL 2. In some embodiments, the gear shifting circuit 14 comprises an IRR filter, although it will be appreciated that other gear shifting circuits may be used.

After being processed by the filter 8, the PHE signal is provided to the DCO 10. The DCO 10 includes a DCO normalization circuit 16 and a DCO core 18. The DCO normalization circuit 16 is configured to normalize an input from the filter 8. For example, normalization of the input from the filter 8 can be achieved by applying a gain multiplier to a modulation path, a PLL path, and/or any other suitable normalization function. The DCO normalization circuit 16 provides a filtered digital error signal (PVT) to the DCO core 18. In some embodiments, the DCO normalization circuit 16 generates an intermediate clock signal (Track_I) which is provided to the DCO core 18. The Track_I signal can be configured as a frequency master clock signal of the DCO 18. The DCO core 18 is a digitally controlled oscillator configured to generate the phase-calibrated clock signal (CKV). In some embodiments, the CKV signal is provided to one or more additional circuit elements, such as radiofrequency (RF) circuit elements.

The CKV signal is further provided to the digitally controlled TDC 30. The digitally controlled TDC 30 receives the CKV signal and compares an edge, such as the rising edge, of the CKV signal to the reference signal (FREF). The TDC 30 generates a rising edge phase variation signal (PHV_F) based on a difference between the CKV signal and the FREF signal. The PHV_F signal is optionally provided to a digital electronic control (DEC) 22 and a normalization circuit 28 for shaping prior to being provided to the phase detector 8. The DEC 22 is configured to perform one or more binary conversions, such as, converting a PHV_F signal received from the TDC from a first bit-width X to a second bit-width Y. Although the illustrated embodiment includes the PHV_F signal being provided by the normalization circuit 28, it will be appreciated that the PHV_F signal can be provided directly from the TDC 30 to the phase detector 8. The PHV_F signal is used to adjust the frequency of the CKV signal to tune the ADPLL 2 (and other attached circuit elements) to the reference frequency FREF. In some embodiments, calibration of the TDC 30 is maintained automatically by a doubler 32, as discussed in more detail below with respect to FIG. 2.

In some embodiments, the CKV signal is provided to a frequency divider 26, which divides the signal by a predetermined amount and provides the divided signal to a sigma delta modulation circuit 24. In some embodiments, the frequency divider divides the CKV signal by a predetermined factor, such as a factor of 2, 4, 8, and/or any other suitable factor. In some embodiments, the delta modification circuit 24 receives an input from the DCO normalization circuit 16. The input signal from the DCO normalization circuit 16 is configured to automatically calibrate the delta modification circuit 24. The delta modification circuit 24 provides an input, Track F, to the DCO core 18. In some embodiments, the CKV signal is further provided to a counter 20. The counter 20 is configured to count the rising edges of the CKV output signal and provide a phase variation input (PHV_I) signal to the phase detector 6.

Figure 2:
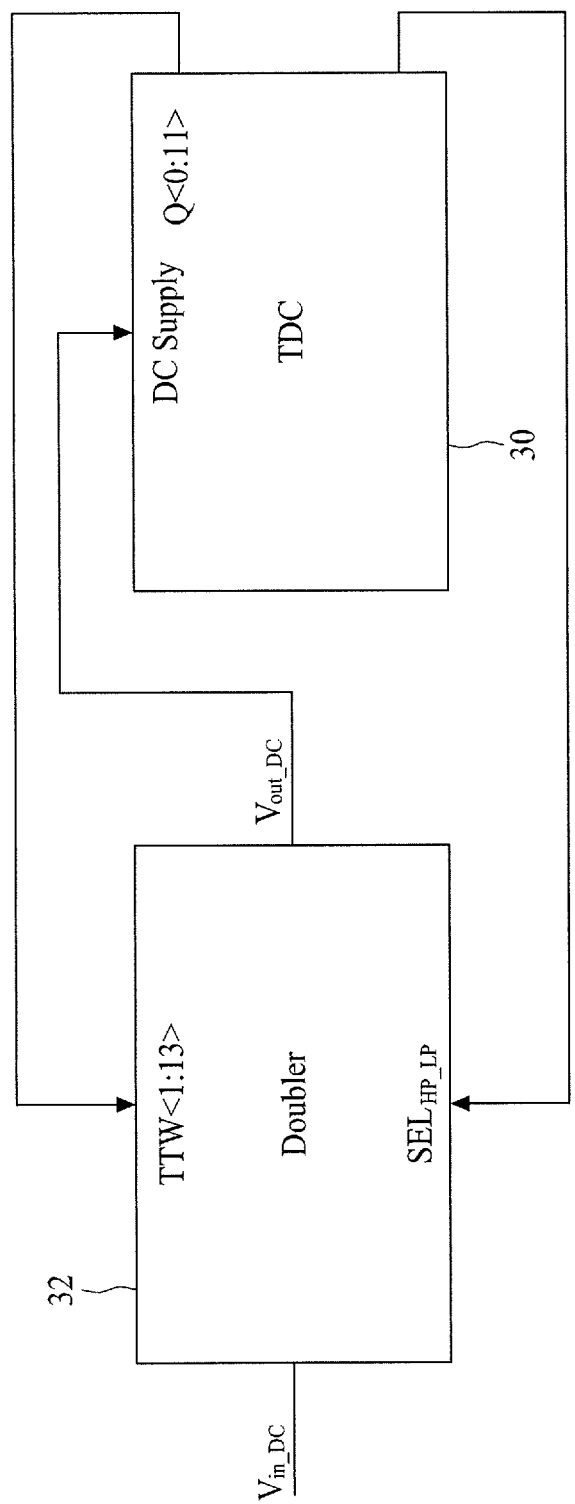
FIG. 2 illustrates the doubler and the TDC of the ADPLL of FIG. 1, in accordance with some embodiments.

FIG. 2 illustrates a TDC 30 and a doubler 32 of the ADPLL 2 of FIG. 1, in accordance with some embodiments. The doubler 32 is configured to receive a voltage input $V_{in\_DC}$. The voltage input $V_{in\_DC}$ has a first voltage. The first voltage can be any suitable voltage value, such as 0.5V, 1V, 1.5V, 2V, and/or any other suitable voltage. The doubler 32 generates a voltage output signal $V_{out\_DC}$. The output voltage $V_{out\_DC}$ has a second voltage value greater than the first voltage value. For example, in some embodiments, the second voltage value is initially configured to be generally about twice the voltage value of the voltage input signal. In some embodiments, the voltage input $V_{in\_DC}$ is 0.5V and the voltage output signal $V_{out\_DC}$ is about 1.0V. The value of the output signal $V_{out\_DC}$ can be affected by one or more circuit parameters, such as process variations, temperature variations, voltage variations (in other portions of the circuit), and/or any other suitable variation. The voltage of the output signal $V_{out\_DC}$ is controlled by adjusting and/or deactivating one or more internal clock signals of the doubler 32, as described in greater detail below with respect to FIGS. 3 and 4. The doubler 32 provides the voltage output signal $V_{out\_DC}$ to a DC supply input of the TDC 30.

Figure 9A:
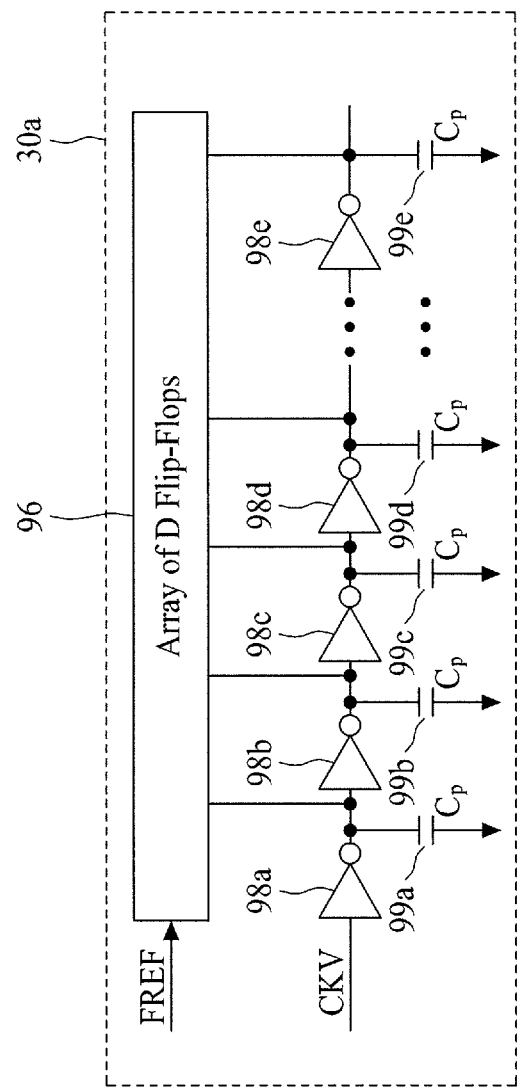
FIG. 9A illustrates a TDC circuit configured to generate a TTW signal, in accordance with some embodiments.
Figure 9B:
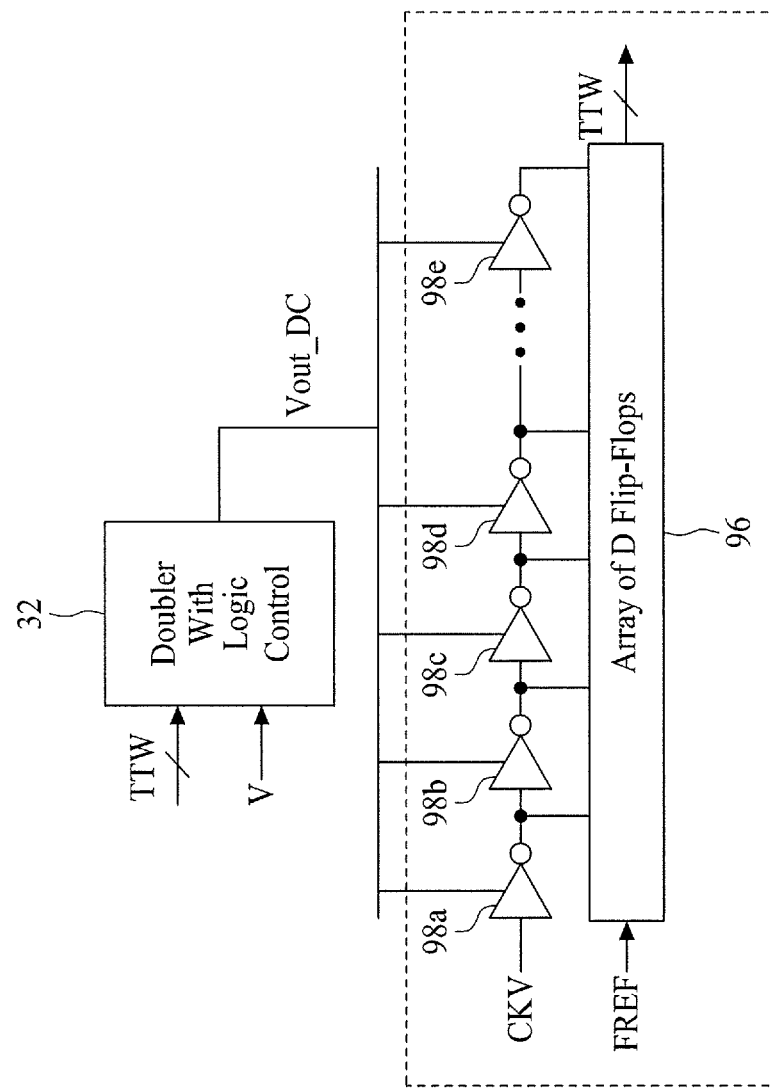
FIG. 9B illustrates a TDC circuit configured to receive a voltage input from a doubler, in accordance with some embodiments.
Figure 10:
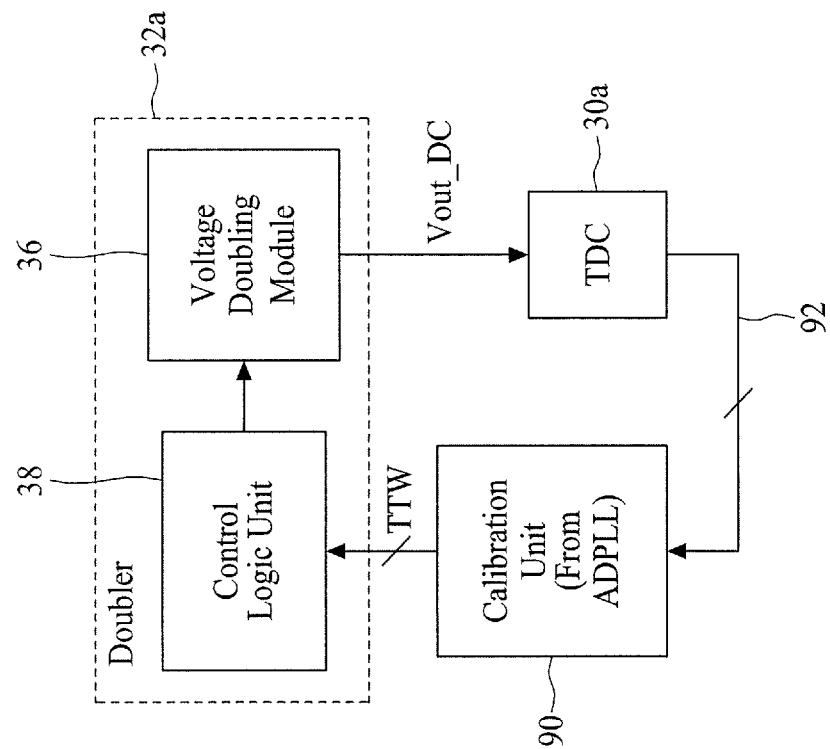
FIG. 10 illustrates a doubler configured to receive a TTW signal from a TDC circuit, in accordance with some embodiments.

In some embodiments, the TDC 30 is configured to generate one or more control signals for the doubler 32. In the illustrated embodiment, the TDC 30 generates an error signal Q<0:12> which indicates a difference between the $V_{out\_DC}$ and a target voltage, such as 1.0V. The error signal Q<0:12> is received at the doubler 32 as a TDC Tuning Word (TTW) input. FIGS. 9A to 10 (described in more detail below) illustrate an embodiment of a TDC 30a configured to generate a TTW, in accordance with some embodiments. The TTW input is decoded by the doubler 32 and controls activation of one or more circuit elements. In some embodiments, the TTW input is provided to a control block of the doubler 32, as described in more detail below with respect to FIGS. 3 and 5. In some embodiments, the TDC generates a power select ($SEL_{HP\_LP}$) signal. The power select signal $SEL_{HP\_LP}$ is configured to indicate one of two operation modes of the TDC, a high-power start-up operation mode and a low-power steady-state operation mode. In some embodiments, the TTW input is configured to select between a high frequency operation mode and a low frequency operation mode of the doubler 32. The TTW signal and the $SEL_{HP\_LP}$ signal are configured to control one or more internal circuit elements to adjust the output of the doubler 32.

FIG. 9A illustrates a TDC circuit 30a configured to generate a TTW signal, in accordance with some embodiments. The TDC circuit 30a is similar to the TDC circuit 30 discussed above, and similar description is not repeated herein. The TDC circuit 30a includes an array of flip-flops 96. The array of flip-flops 96 can include any suitable flip-flops, such as, for example, D-type flip-flops. Each flip-flop in the array of flip-flops 96 is configured to receive a reference signal (FREF) at an input. The TDC circuit 30a further includes a plurality inverters 98a-98e (collectively "the inverters 98"). The inverters 98 are coupled in series with a first inverter 98a in the chain receiving a clock input (CKV) from a source. For example, as shown in FIG. 1, in some embodiments, a DCO 10 generates a CKV signal. An output of each of the inverters 98 is provided as a clock input to one of the flip-flops in the array of flip-flops 96. For example, in the illustrated embodiment, a first inverter 98a generates a first clock signal for a first flip-flop in the array of flip-flops 96, a second inverter 98b generates a second clock signal for a second flip-flop in the array of flip-flops 96, and subsequent flip-flops 98c-98e generate subsequent clock signals for respective flip-flops in the array of flip-flops 96.

In some embodiments, a capacitor 99a-99e is coupled to each of the inverters 98 to control the response time (Δt) thereof. In some embodiments, the response time Δt is:

$$\Delta t = \frac{C_{LOAD}}{I}$$

where $C_{Load}$ is equal to the capacitance of the inverter 98a-98e ($C_{INV}$) plus the capacitance of an associated capacitor ($C_{par}$). The array of flip flops 96 generates the multi-bit TTW signal. In some embodiments, each of the flip-flops in the array of flip-flops 96 outputs one bit of the multi-bit TTW signal.

In some embodiments, each of the inverters 98 are configured to receive an input voltage from the doubler 32. As shown in FIG. 9B, in some embodiments, each of the inverters 98 is coupled to an output of the doubler 32. The doubler 32 is configured to provide an output voltage, such as $V_{out\_}DC$. The output voltage controls operation of each of the inverters 98. In some embodiments, the output 92 of the array of flip-flops 96 is provided to the doubler 32 as a TTW signal.

FIG. 10 illustrates a doubler 32a configured to receive a TTW signal from the TDC 30a and a calibration unit 90, in accordance with some embodiments. The doubler 32a is similar to the doubler 32 discussed above, and similar description is not repeated herein. The doubler 32a includes a control block 38 and a voltage doubling module 36. The control block 38 receives a TTW input from the TDC 30. In some embodiments, the calibration unit 90 is configured to adjust the TTW signal received from the TDC 30a prior to providing the TTW signal to the control block 38. For example, in some embodiments, the TDC 30a generates an output signal 92 having a first bit-width (e.g., containing a first number of bits). The output signal 92 is provided to the calibration unit 90 which generates a TTW signal having a second bit-width different than the first bit-width. The TTW signal is provided to the control block 38, which controls the voltage doubling module 36 (as discussed in more detail below with respect to FIG. 3) to generate a doubled output signal $V_{out\_}DC$. In some embodiments, the doubled output signal is provided as an input to the TDC 30, which is configured to adjust the doubler 32a (through the TTW signal) to adjust the doubled output signal as needed.

Figure 3:
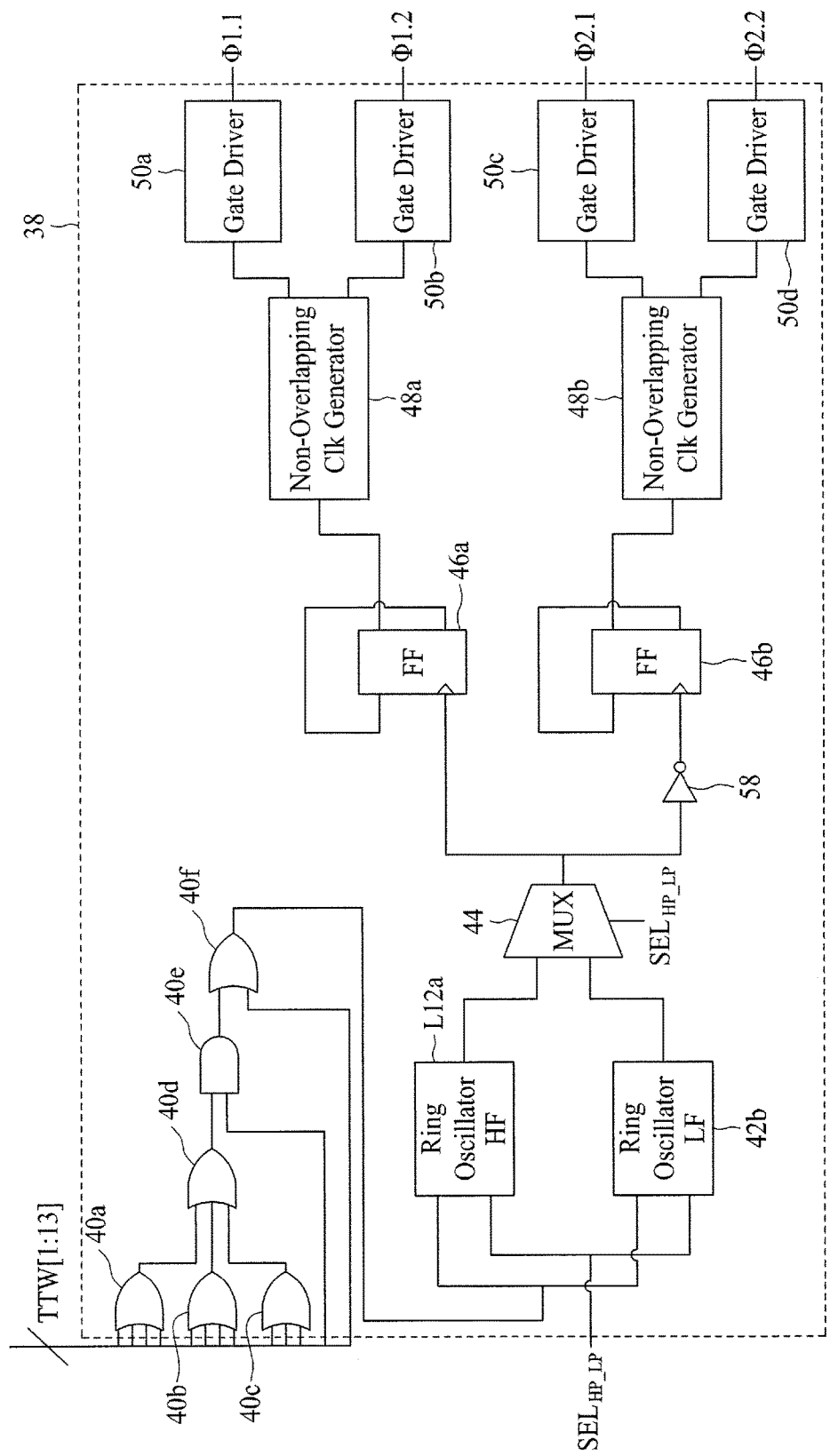
FIG. 3 illustrates a logic diagram of a control block of the doubler of FIG. 2, in accordance with some embodiments.

FIG. 3 illustrates one embodiment of a control block 38 of the doubler 32, in accordance with some embodiments. The control block 38 receives one or more control signals from the TDC 30, such as a TTW signal and/or an $SEL_{HP\_LP}$ signal. The TTW signal is provided to a plurality of logic gates 40a-40f. The plurality of logic gates 40a-40f decode the TTW signal and provide an activation signal to one or more ring oscillators, such as a first ring oscillator 42a and a second ring oscillator 42b. In some embodiments, the first ring oscillator 42a is a high frequency ring oscillator and the second ring oscillator 42b is a low frequency ring oscillator, although it will be appreciated that other embodiments are possible and are within the scope of this disclosure. In some embodiments, the doubler 32 is can be configured to generate a doubled voltage for one of two or more circuits, such as a high-power circuit and a low-power circuit. In the illustrated embodiment, the high frequency ring oscillator 42a corresponds to power generation for a high-power circuit and the low frequency ring oscillator 42b corresponds to power generation for a low-power circuit. The TTW signal is configured to activate one or more of the ring oscillators 42a, 42b to generate an oscillating signal, such as a square wave.

In some embodiments, the $SEL_{HP\_LP}$ signal is configured to select one the first ring oscillator 42a and/or the second ring oscillator for operation. For example, in some embodiments, the $SEL_{HP\_LP}$ signal is provided to each of the first ring oscillator 42a and the second ring oscillator 42b to control operation of the oscillators for high power and/or low power output. In some embodiments, a first value of the $SEL_{HP\_LP}$ signal activates the first ring oscillator 42a and deactivates the second ring oscillator 42b and a second, opposite value activates the second ring oscillator 42b and deactivates the first ring oscillator 42a, although it will be appreciated that alternative control schemes are within the scope of this disclosure. In some embodiments, each of the ring oscillators 42a, 42b are controlled and/or activated by the TTW signal and do not receive the $SEL_{HP\_LP}$ signal.

In some embodiments, each of the ring oscillators 42a, 42b are coupled to a multiplexer 44. The multiplexer 44 receives an input from each of the ring oscillators 42a, 42b and provides an output on a single circuit path. In some embodiments, the multiplexer 44 can be omitted and the output of each of the ring oscillators 42a, 42b can be provided directly to each of the flip-flops 46a, 46b. The multiplexer 44 is configured to isolate the high-frequency ring oscillator 42a from the low-frequency ring oscillator 42b. In other embodiments, the ring oscillators 42, 42b are simultaneously activated by the TTW signal and the multiplexer 44 is configured to select the output of one of the ring oscillators 42a, 42b. The multiplexer 44 can be controlled by one or more input signals, such as, for example, the $SEL_{HP\_LP}$ signal. For example, in some embodiments, the multiplexer 44 receives the $SEL_{HP-LP}$ signal and determines which of the ring oscillator 42a, 42b inputs are provided to the output based on the $SEL_{HP-LP}$ signal. In some embodiments, the output of the multiplexer 44 is received by one or more flip-flops 46a, 46b.

In some embodiments, a first flip-flop 46a receives an input from the multiplexer 44 and a second flip-flop 46b receives an inverse input from the multiplexer 44. For example, in some embodiments, an inverter 58 is positioned between an output of the multiplexer 44 and an input of the second flip-flop 46b. In some embodiments, the input from the multiplexer 44 is coupled to a set input of each of the flip-flops 46a, 46b to transition the flip-flops 46a, 46b on a rising edge of an input signal such that the first flip-flop 46a will transition on a rising edge of the multiplexer 44 output and the second flip-flop 46b will transition on a falling edge of the multiplexer 44 output (as the multiplexer output is inverted prior to reaching the second flip-flop 46b). Each of the flips-flops 46a, 46b is electrically coupled to a respective non-overlapping clock generator 48a, 48b. The non-overlapping clock generators 48a, 48b are controlled by the outputs of the flip-flops 46a, 46b. When the non-inverted output (e.g., Q) of a flip-flop 46a, 46b is set high, the respective non-overlapping clock generator 48a, 48b is activated to generate a clock signal. The clock generators 48a, 48b are referred to herein as non-overlapping clock generators to indicate that only one of the clock generators 48a, 48b are active at any time. For example, when the first non-overlapping clock generator 48a is active, the second non-overlapping clock generator 48b is not active. Similarly, when the second non-overlapping clock generator 48b is active, the first non-overlapping clock generator 48a is not active.

The non-overlapping clock generators 48a, 48b are connected to gate drivers 50a-50d. The gate drivers 50a-50d are configured to generate phase output signals. For example, in the illustrated embodiment, the first non-overlapping clock generator 48a is electrically coupled to a first gate driver 50a and a second gate driver 50b and the second non-overlapping clock generator 48b is electrically coupled to a third gate driver 50c and a fourth gate driver 50d. When the first non-overlapping clock generator 48a is active, the first gate driver 50a generates a first phase output signal $\Phi_{1\_1}$ and the second gate driver 50b generates a second phase output signal $\Phi_{1\_2}$. The first phase output signal $\Phi_{1\_1}$ and the second phase output signal $\Phi_{1\_2}$ have opposite phases (e.g., are 180 degrees apart). Similarly, when the second non-overlapping clock generator 48b is active, the third gate driver 50c generates a third phase output signal $\Phi_{2\_1}$ and the fourth gate driver 50d generates a fourth phase output signal $\Phi_{2\_2}$. The third phase output signal $\Phi_{2\_1}$ and the fourth phase output signal $\Phi_{2\_2}$ have opposite phases (e.g., are 180 degrees apart). The frequency of the phase output signals $\Phi_{1\_1}$, $\Phi_{1\_1}$, $\Phi_{2\_1}$, $\Phi_{2\_1}$ is determined by the activation/deactivation of the non-overlapping clock generators 48a, 48b.

Figure 4A:
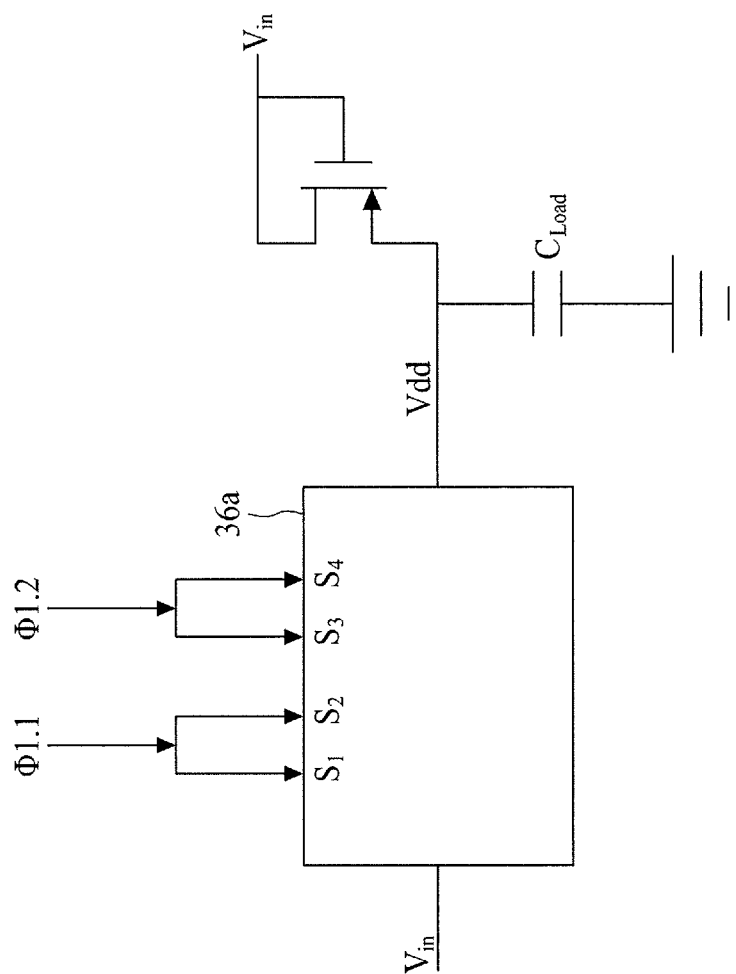
FIG. 4A illustrates a doubler circuit configured to receive a subset of control signals from the control block of FIG. 3, in accordance with some embodiments.
Figure 4B:
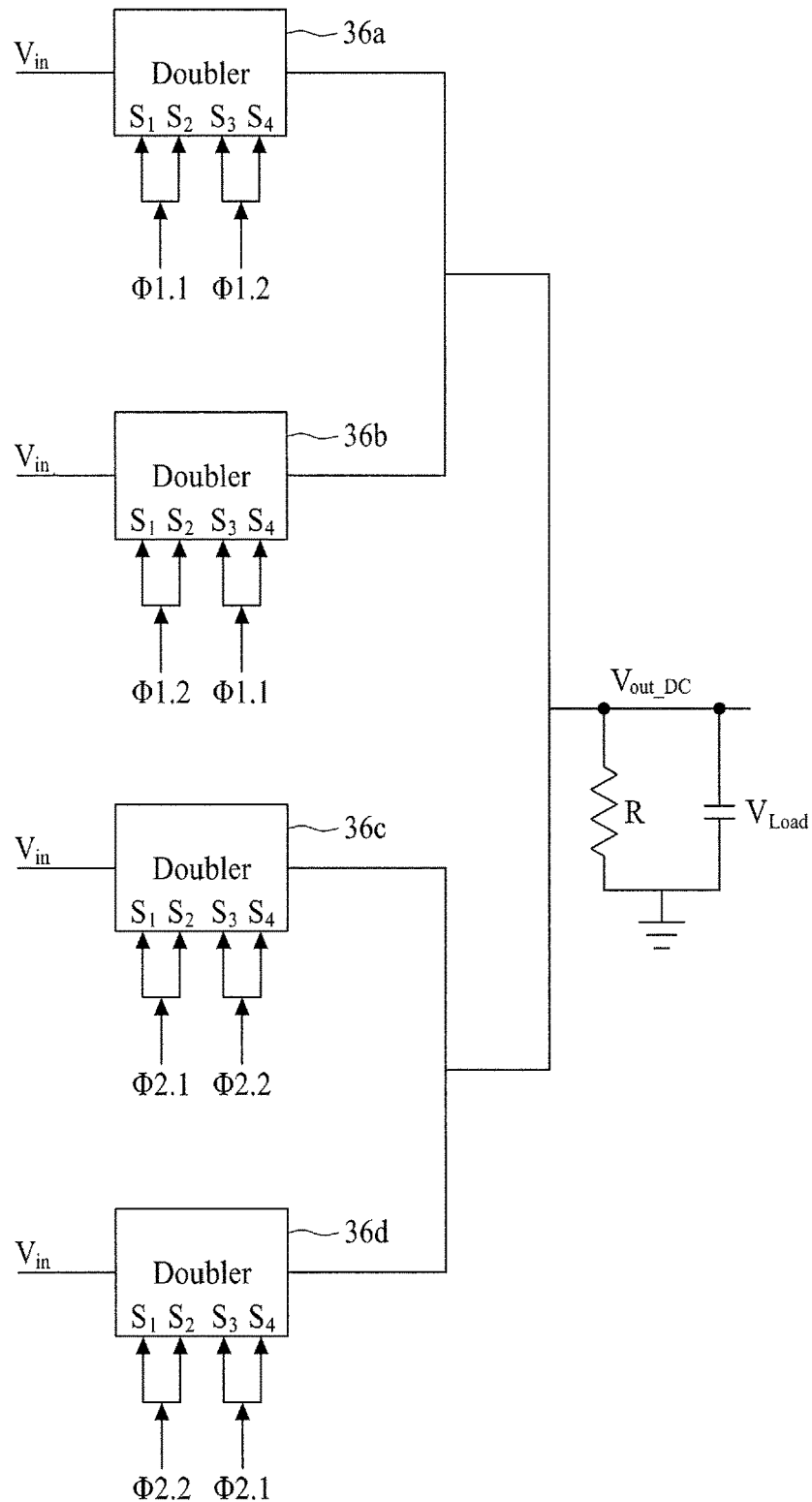
FIG. 4B illustrates a plurality of doubler circuits configured to receive phase outputs from the control block of FIG. 3, in accordance with some embodiments.

In some embodiments, each of the phase output signals are provided to one or more voltage doubling module 36a-36d as shown in FIGS. 4A-4B. As shown in FIG. 4A, one or more of the phase components $\Phi_{1\_1}$ and $\Phi_{1\_2}$ are received at a voltage doubling module 36a. The voltage doubling module 36a further receives a voltage input $V_{in}$ and generates a voltage output based on the phase components $\Phi_{1\_1}$ and $\Phi_{1\_2}$. In some embodiments, as shown in FIG. 4B, a first set of voltage doubling module 36a, 36b receive first power phase components $\Phi_{1\_1}$ and $\Phi_{1\_2}$ and a second set of voltage doubling module 36c, 36d receive second power phase components $\Phi_{2\_1}$ and $\Phi_{2\_2}$, although it will be appreciated that other arrangements are possible and are within the scope of this disclosure. Only one set of voltage doubling modules, either a first set including a first and second voltage doubling modules 36a, 36b or a second set including a third and fourth voltage doubling modules 36c, 36d, are active during operation. In some embodiments, each of the power phase components $\Phi_{1\_1}$, $\Phi_{1\_2}$, $\Phi_{2\_1}$, $\Phi_{2\_2}$ are provided twice to the respective voltage doubling modules 36a, 36b (e.g., two inputs and/or one input and provided to two sets of doubling components) to reduce ripple and provide for fast charge/discharge of the voltage doubling modules 36a, 36b.

For example, during a high-frequency start-up mode, the $SEL_{HP\_LP}$ signal indicates a high-frequency/high-power operation. The control circuit 38 is controlled by the $SEL_{HP\_LP}$ signal and the TTW signal such that the first ring oscillator 42a (i.e., a high-frequency ring oscillator) generates a high-frequency signal that is provided to each of the first and second flip-flops 46a, 46b. The high-frequency signal alternatively activates each of the non-overlapping clock generators 48a, 48b. When the first non-overlapping clock generator 48a is active, the first set of phase output signals $\Phi_{1\_1}$ and $\Phi_{1\_2}$ are generated to drive first and second doubling modules 36a, 36b. After a predetermined time period (e.g., one period of the high-frequency signal), the first non-overlapping clock generator 48a is deactivated and the second non-overlapping clock generator 48b is activated. The second non-overlapping clock generator 48b controls the second set of gate drivers 50c, 50d to generate the second set of phase output signals $\Phi_{2\_1}$ and $\Phi_{2\_2}$. By switching between the first set of phase output signals $\Phi_{1\_1}$ and $\Phi_{1\_2}$ and the second set of phase output signals $\Phi_{2\_1}$ and $\Phi_{2\_2}$, the doubler 32 reduces the ripple in the doubled voltage output signal ($V_{out}\_DC$). When the $SEL_{HP\_LP}$ signal indicates a shift to a low-power/low-frequency steady state mode, the first ring oscillator 42a is deactivated and the second ring oscillator 42b (e.g., the low-frequency ring oscillator) is activated to drive the non-overlapping clock generators 48a, 48b (and therefore the gate drivers 50a-50d) at a lower frequency corresponding to the lower power requirements of the circuit. Each of the voltage doubling modules 36a-36d generate an output based on the received phase component signals such that output signal $V_{out}\_DC$ provides a selected voltage value, such as twice the value of an input voltage $V_{in}\_DC$. In addition, the frequency of the phase component signals charges the capacitor $C_{load}$ at a predetermined rate.

Figure 5:
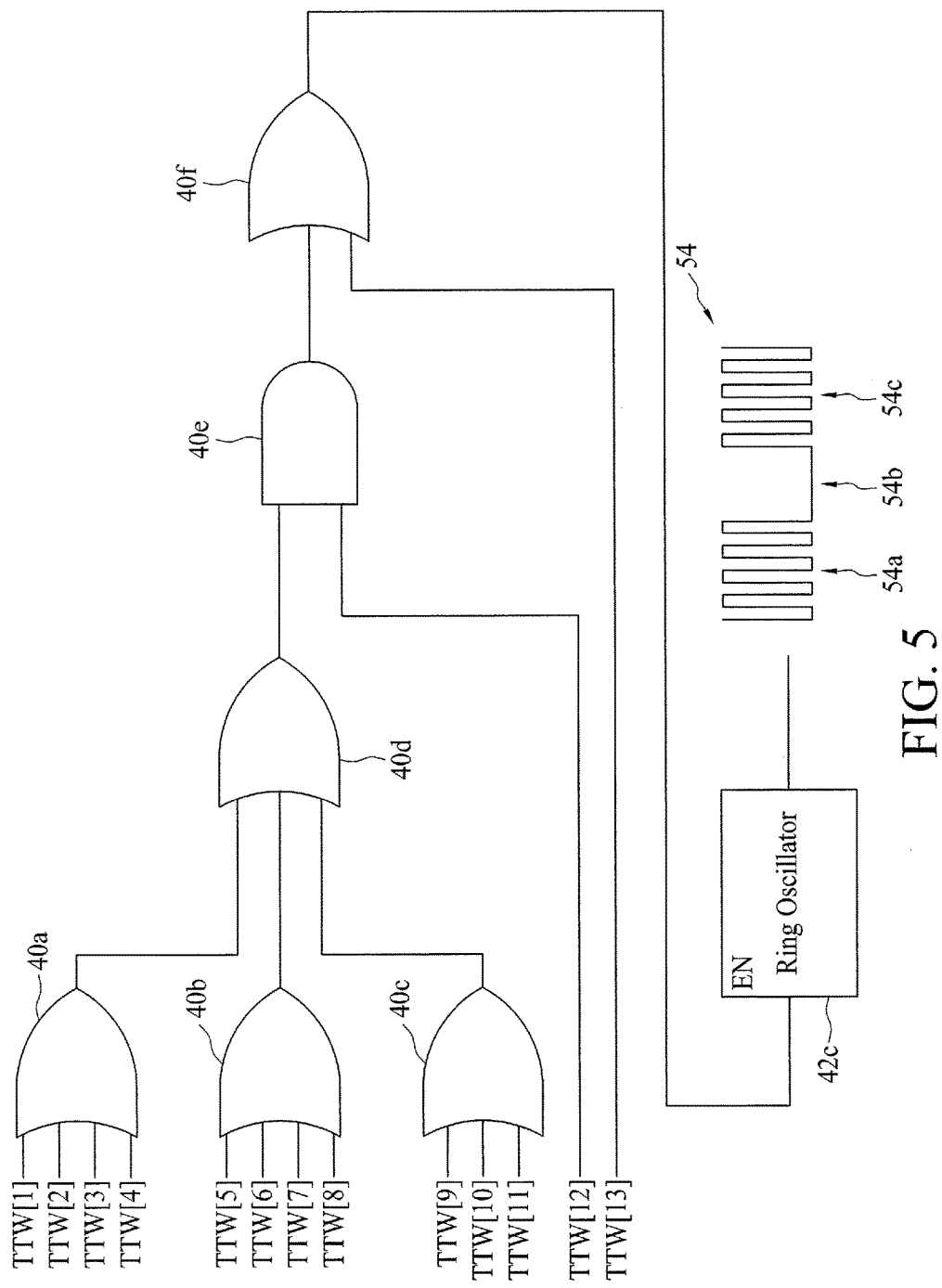
FIG. 5 illustrates a plurality of logic gates configured to provide TDC tuning word decoding in the control block of FIG. 3, in accordance with some embodiments.

FIG. 5 illustrates one embodiment of the logic gates 40a-40f of the doubler control circuit 38 of FIG. 3. As shown in FIG. 5, each of the logic gates 40a-40f receives one or more of the bits of the TTW signal as an input. The logic gates 40a-40f decode the TTW signal and generate an output signal which is provided to an enable input of a ring oscillator 42c. When logic gates 40a-40f provide a predetermined input to the enable input (such as a logic 1), the ring oscillator is activated. The ring oscillator 42c can be a low power ring oscillator and/or a high power ring oscillator. The ring oscillator 42c generates an output signal 54. The output signal 54 is configured to control operation of one or more circuit elements, such as one or more flip-flops 46a, 46b, non-overlapping clock generators 48a, 48b and/or gate drivers 50a-50d. The ring oscillator 42c is coupled to one or more of additional circuit elements (see FIGS. 3-4B) that generate an output $V_{out\_}^{DC}$. Adjusting the output of the ring oscillator 42c, for example, by skipping a portion of an output signal 54, adjusts the output voltage $V_{out\_}^{DC}$. For example, in some embodiments, the ring oscillator 42a generates an output signal 54 having a square-wave 54a that cycles a flip-flop 46a, 46b at a predetermined rate to adjust the one or more phase output signals, such as $\Phi_{1\_1}$ and $\Phi_{1\_2}$ provided to one or more voltage doubling modules circuits 36. In some embodiments, a delay in the ring oscillator 42c is adjusted by one or more inputs, such as a TTW input. A decreased delay causes an increase in the output voltage $V_{out}$. When the voltage $V_{out\_DC}$ exceeds the predetermined threshold, the ring oscillator 42c is deactivated (as shown in section 54b of the output signal 54) and the output voltage $V_{out\_DC}$ is maintained at a present value (and/or subject to fluctuations caused by operation and design of the ADPLL 2). If the TTW input indicates that the error Q<0:12> of the output voltage $V_{out\_DC}$ is outside a predetermined range, the ring oscillator 42c is activated to generate a new square-wave 54c.

Figure 6A:
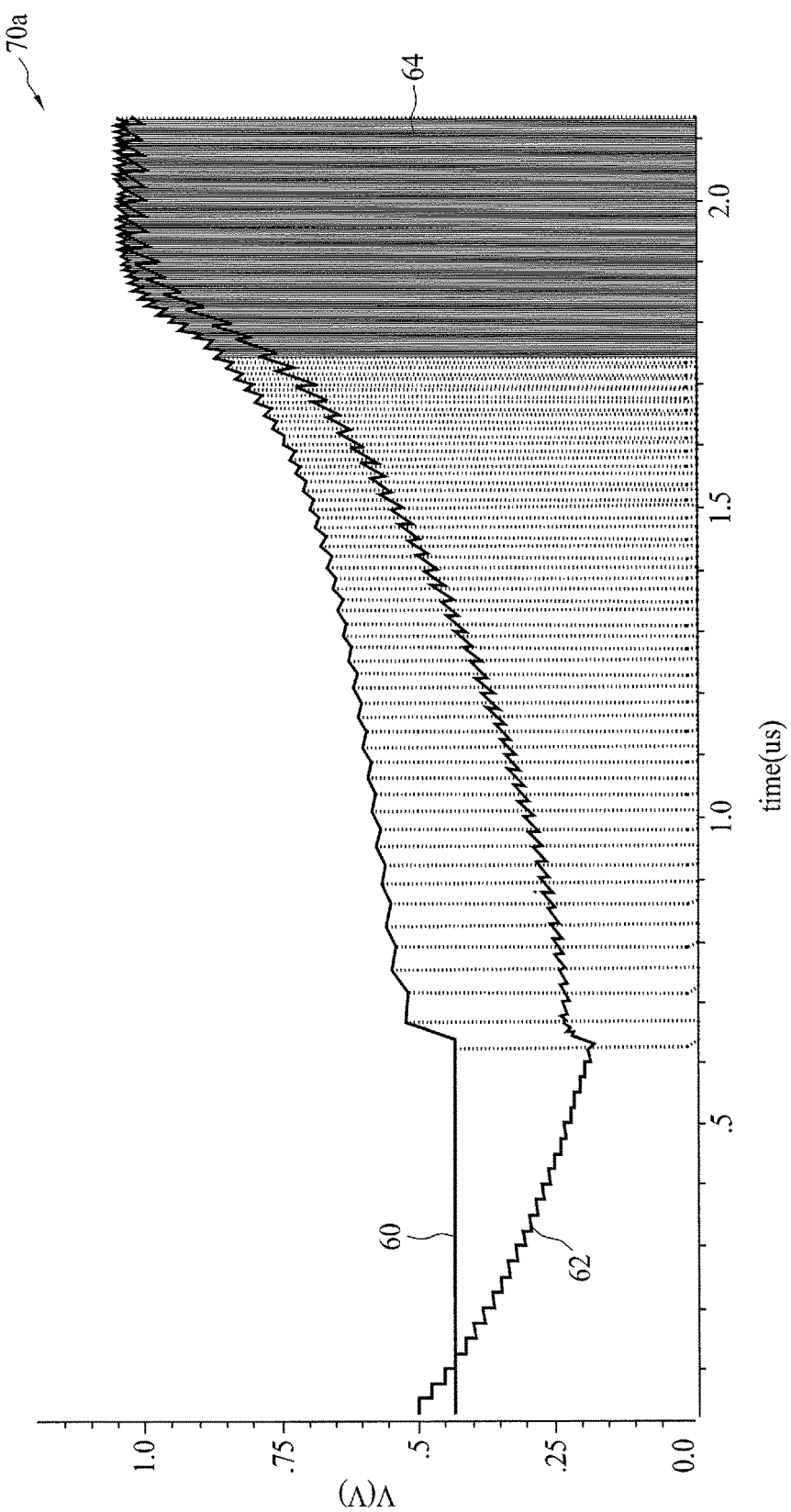
FIGS. 6A-6C are charts illustrating the performance of the doubler and TDC of FIG. 1, in accordance with some embodiments.
Figure 6B:
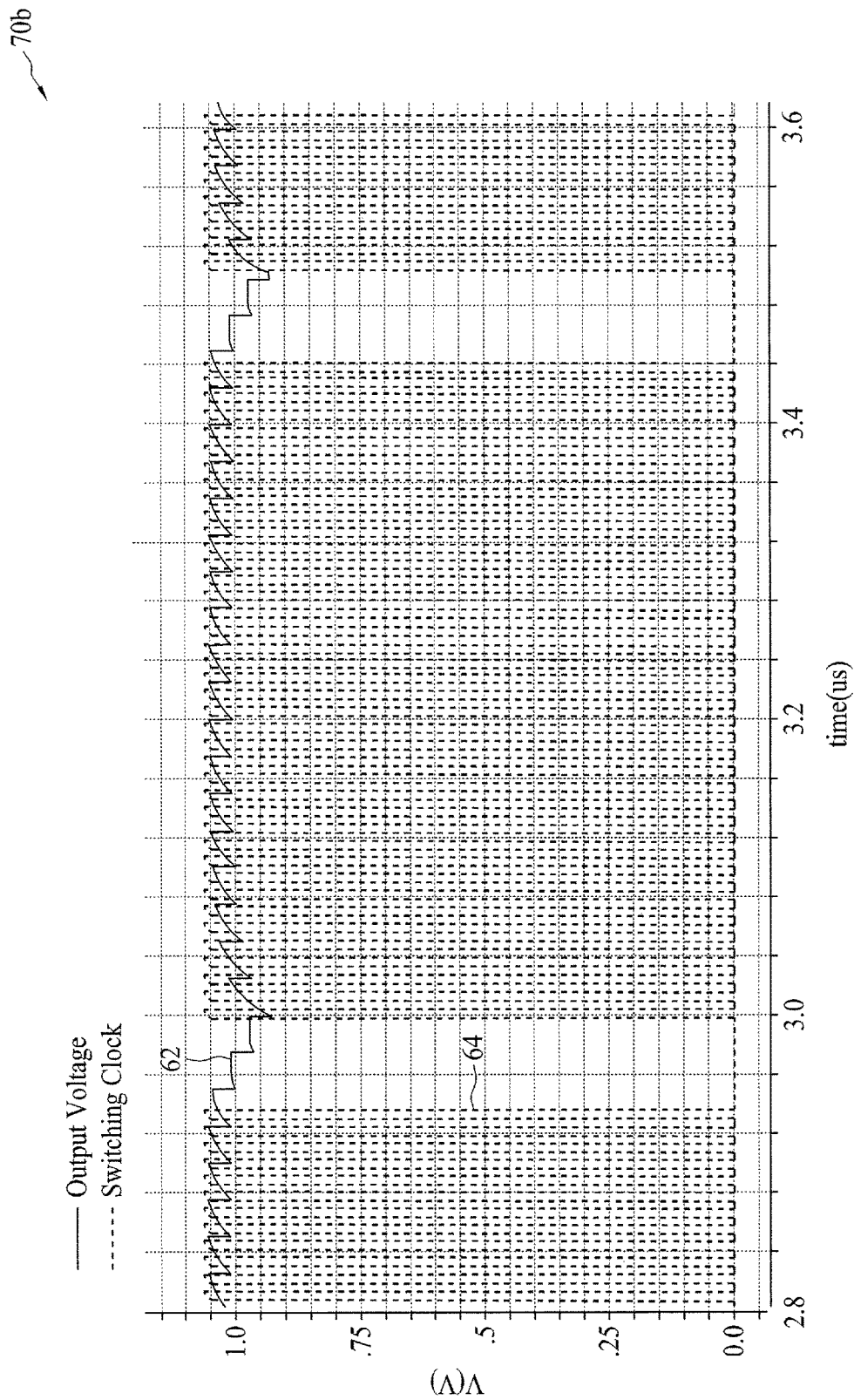
Figure 6C:
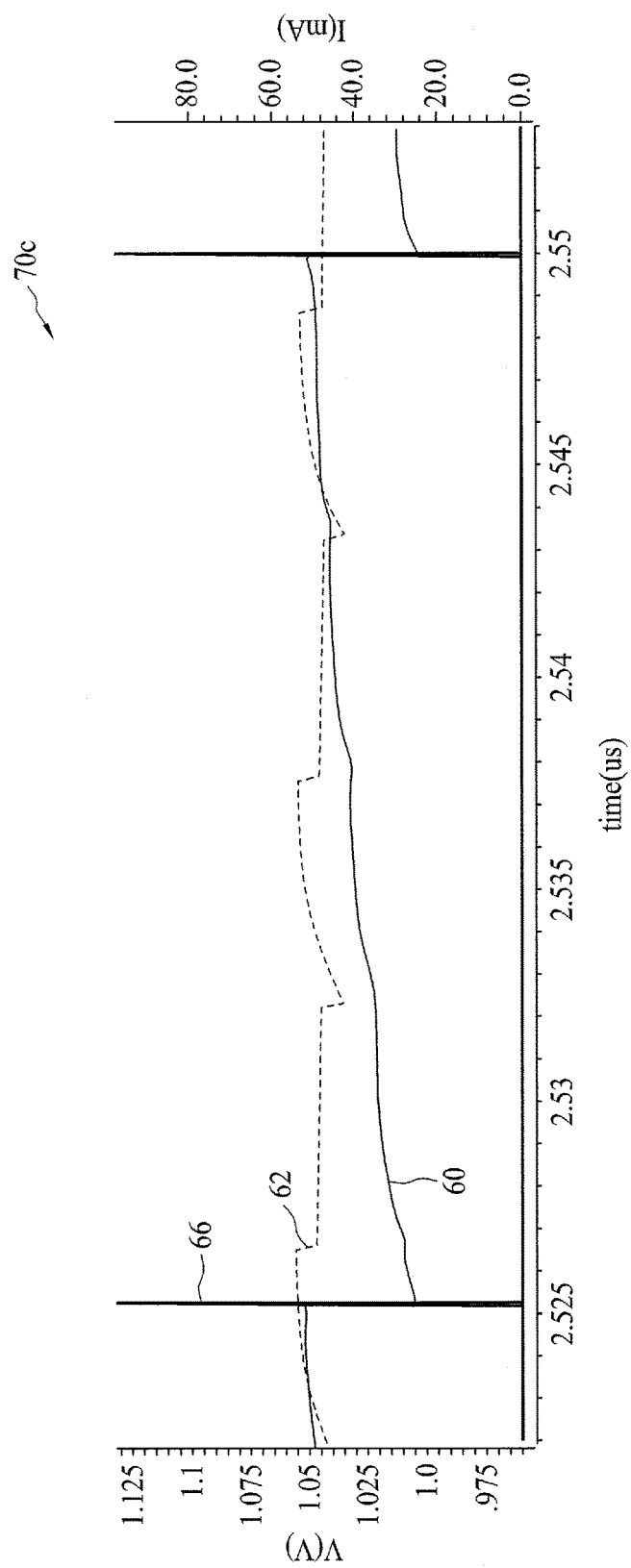

FIGS. 6A-6C are graphs 70a-70c illustrating operation of the ADPLL 2. FIG. 6A illustrates a comparison of an output voltage 60 of a ADPLL 2 compared to a doubler output 62 and a switching clock signal 64. In some embodiments, the switching clock signal 64 is generated by one or more ring oscillators 42a-42c. As shown in FIG. 6A, the doubler output 62, such as the output of doubler 32 of the ADPLL 2, is about 0.5V at time 0. After about 5 microseconds, the TTW signal causes the switching clock signal 64 to activate. As the delay in the switching clock 64 is decreased (e.g., the frequency of the switching clock 64 is increased), the doubler output 62 increases until reaching about 1.0V. The output voltage 60 initially drops but increases to the value of the doubler output 62 over the same time period. The output voltage 60 and the doubler output 62 remain constant at about 1.0V.

As shown in FIG. 6B, the output voltage 62 is maintained at about 1.0V. When the switching clock signal 64 is temporarily skipped (e.g., the TTW signal indicates that the output voltage is at a predetermined voltage level), the output voltage decreases. When the output voltage signal 60 drops below a predetermined threshold (e.g., the error signal Q<0:12> is outside an acceptable range), the switching clock signal 64 is enabled and the output voltage signal 60 returns to the predetermined value.

FIG. 6C illustrates a TDC current signal 66 compared to the output voltage signal 60 and the doubler output signal 62. As shown in FIG. 6C, when the output voltage signal 60 reaches a voltage value substantially equal to the doubler output 62, the TDC generates a spike in the current signal 66. The period of the current signal 66 is equal to the ramp time of the output voltage signal from a first value, such as about 1.0V, to a second value, such as about 1.05V. The TDC current signal 66 can be adjusted by controlling one or more doubler circuits 32 to increase and/or decrease a voltage output 62. The TDC current signal 66 can be provided to one or more additional circuit elements, such as the phase detector 8 of the ADPLL.

Figure 7:
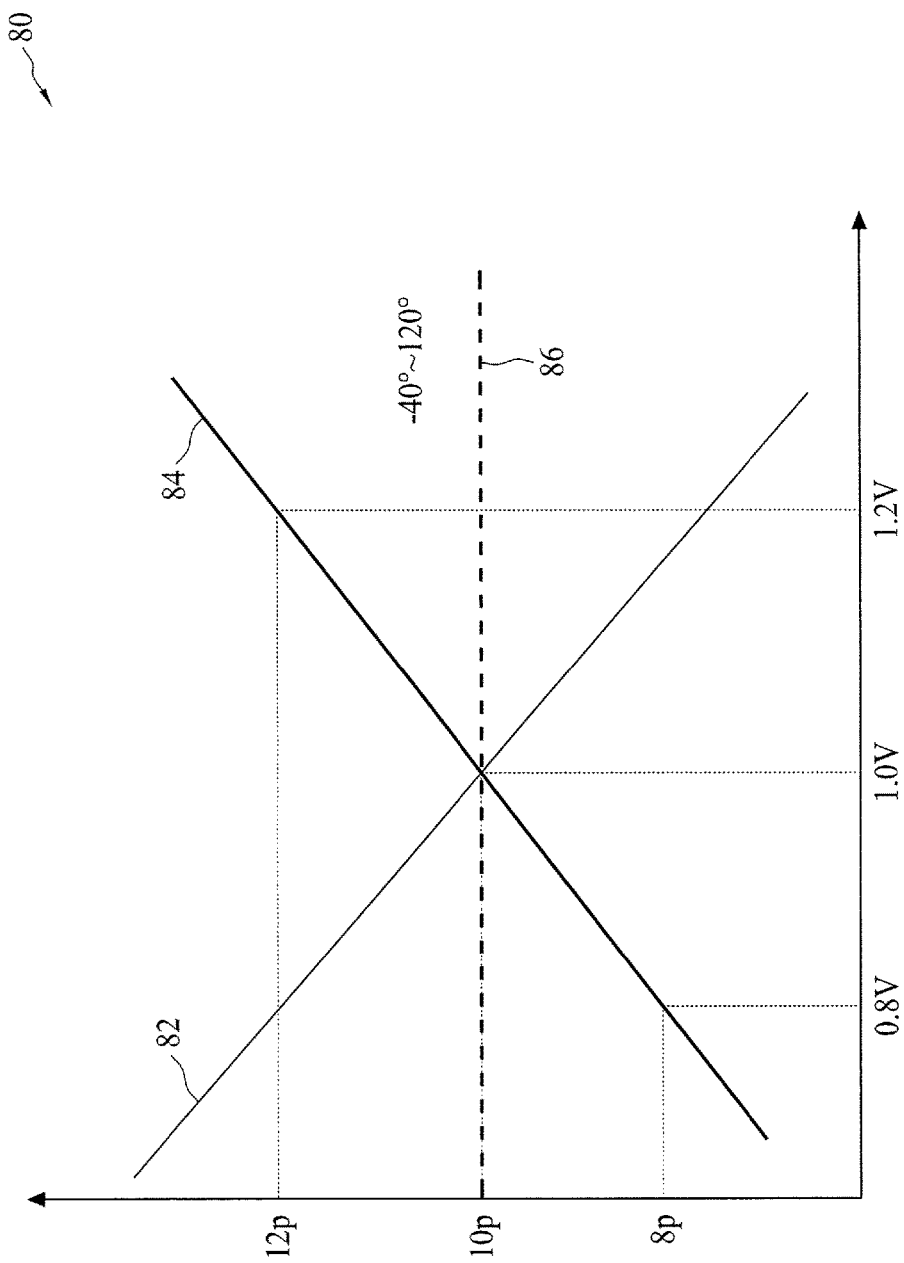
FIG. 7 is a chart illustrating performance characteristics of the TDC of FIG. 2, in accordance with some embodiments.

FIG. 7 is a graph 80 illustrating the resolution of a TDC 30. A first line 82 illustrates the resolution of a traditional TDC (e.g., response time of the TDC not using the disclosed automatic doubler calibration) plotted against voltage. A second line 84 illustrates the resolution of a traditional TDC plotted against temperature. A third line 86 illustrates the resolution of a TDC 30 over a range of temperatures from about −40° to about 120°. As shown in FIG. 7, the TDC 30 maintains a constant response time 86 of about 10 picoseconds despite increase in the temperature or variation in the voltage of the TDC 30.

Figure 8:
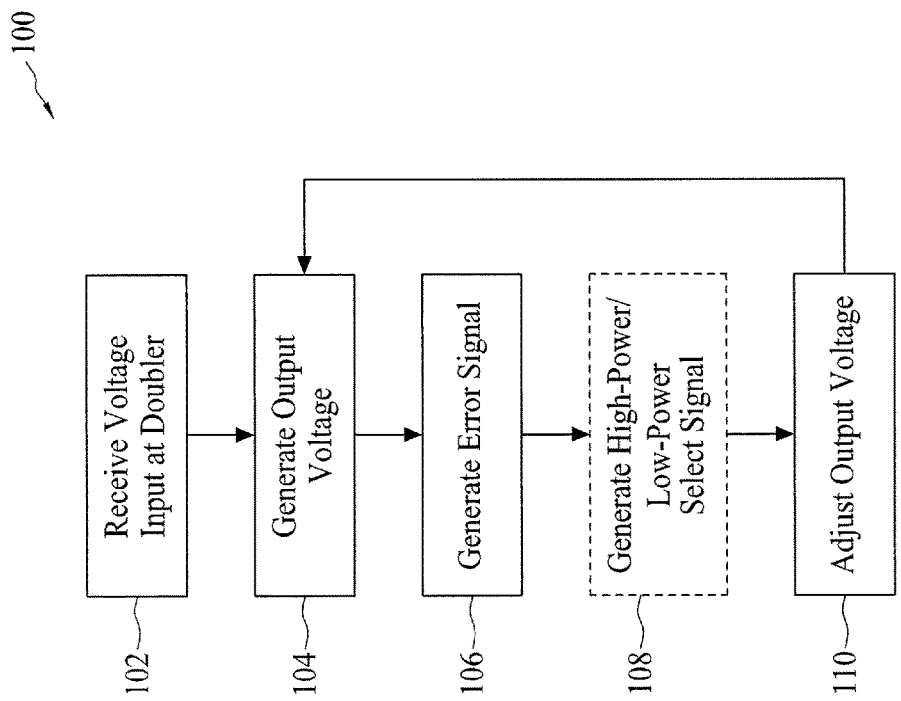
FIG. 8 is a flowchart illustrating operation of the TDC circuit and doubler of the ADPLL circuit of FIG. 1, in accordance with some embodiments.

FIG. 8 is a flowchart illustrating a method 100 of operation of the TDC 30 and the doubler 32, in accordance with some embodiments. At step 102, the doubler 32 receives a voltage input, $V_{in\_DC}$, having a predetermined value, such as, for example, 0.5V. At step 104, the doubler 32 generates an output voltage, $V_{out\_DC}$. The output voltage is provided to a digitally-controlled TDC 30. In some embodiments, $V_{out\_DC}$ has a voltage value that is nominally twice the voltage value of $V_{in\_DC}$.

At step 106, the TDC 30 generates an error signal Q<0:12> that indicates a difference between $V_{out\_DC}$ and a target voltage. The error signal Q<0:12> is provided to the doubler 32 as a TDC tuning word (TTW) input. In some embodiments, at an optional step 108, the TDC generates a $SEL_{HP\_LP}$ signal configured to select one of a high power start-up operation mode or a low-power steady state operation mode of the doubler 32.

At step 110, the doubler 32 decodes the TTW signal using a plurality of logic gates 40a-40f. The TTW signal controls operation of one or more circuit elements of the doubler 32, such as a ring oscillator 42a-42c. At step 110, $V_{out\_DC}$ is adjusted by the doubler 32 based on the TTW signal and/or the $SEL_{HP\_LP}$ signal. For example, in some embodiments, the TTW signal and the $SEL_{HP\_LP}$ signal activate one or more ring oscillators to adjust a delay in the activation of a clock generator 48a. The method 100 returns to step 104 and the adjusted $V_{out\_DC}$ signal is provided to the TDC 30.

In various embodiments a circuit includes a time-to-digital converter (TDC) configured to generate a signal indicative of a phase difference between a first signal and a reference signal and a doubler electrically coupled to the TDC. The doubler is configured to receive a first voltage signal and generate a second voltage signal. The second voltage signal is provided to a voltage input of the TDC. The TDC is configured to generate one or more control signals for the doubler to adjust the second voltage signal.

In various embodiments, an all-digital phase locked loop (ADPLL) includes a phase detector, a filter electrically coupled to the phase detector, and a digitally-controlled oscillator electrically coupled to the filter. The digitally controlled oscillator is configured to generate a phase-corrected clock signal. The ADPLL further includes a time-to-digital converter (TDC) configured to receive the phase-corrected clock signal from the digitally-controlled oscillator. The TDC is electrically coupled to the phase detector to provide a phase-correction signal to the phase detector. A doubler is electrically coupled to the TDC. The doubler is configured to receive a first voltage signal and generate a second voltage signal. The second voltage signal is provided to a voltage input of the TDC.

In various embodiments, a method of calibrating a time-to-digital convertor (TDC) is disclosed. The method includes receiving a first voltage at an input of a doubler circuit and generating a second voltage at an output of the doubler circuit. The second voltage is greater than the first voltage. The output of the doubler circuit is coupled to an input of the TDC. A TDC tuning word (TTW) is generated and provided to the doubler circuit. The second voltage is adjusted based on the TTW.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a time-to-digital converter (TDC) configured to generate a phase variation signal indicative of a phase difference between a first signal and a reference signal; and
   a doubler electrically coupled to the TDC, wherein the doubler is configured to receive a first voltage signal and generate a second voltage signal, wherein the second voltage signal is provided to a voltage input of the TDC, and wherein the TDC generates one or more control signals configured to adjust the second voltage signal, wherein the doubler comprises:
   a first ring oscillator;
   a first flip-flop electrically coupled to the first ring oscillator; and
   a first clock generator electrically coupled to an output of the first flip-flop.

2. The circuit of claim 1, wherein the second voltage signal has a target voltage value equal to about twice a voltage value of the first voltage signal.

3. The circuit of claim 1, wherein the one or more control signals comprise a TDC tuning word (TTW), and wherein the TDC generates the TTW based on a detected error between the second voltage signal and a target voltage.

4. The circuit of claim 3, wherein the doubler comprises a plurality of logic gates configured to decode the TTW.

5. The circuit of claim 1, wherein the doubler comprises:
a second ring oscillator;
a second flip-flop electrically coupled to the second ring oscillator; and
a second clock generator electrically coupled to an output of the second flip-flop.

6. The circuit of claim 5, wherein the first ring oscillator is a high-frequency ring oscillator and the second ring oscillator is a low-frequency ring oscillator.

7. The circuit of claim 1, wherein the first clock generator is electrically coupled to a first drive circuit configured to generate a first phase output signal and a second drive circuit configured to generate a second phase output signal.

8. The circuit of claim 7, wherein the first phase output signal and the second phase output signal have opposite phases.

9. The circuit of claim 1, wherein the first signal is a clock signal generated by an all-digital phase locked loop circuit.

10. An all-digital phase locked loop (ADPLL), comprising:
a phase detector;
a filter electrically coupled to the phase detector;
a digitally-controlled oscillator electrically coupled to the filter, wherein the digitally controlled oscillator is configured to generate a phase-corrected clock signal;
a time-to-digital converter (TDC) configured to receive the phase-corrected clock signal, wherein the TDC is electrically coupled to the phase detector to provide a phase-correction signal to the phase detector; and
a doubler electrically coupled to the TDC, wherein the doubler is configured to receive a first voltage signal and generate a second voltage signal, and wherein the second voltage signal is provided to a voltage input of the TDC, wherein the doubler comprises a control block comprising:
a high-frequency path comprising:
  a first ring oscillator;
  a first flip-flop electrically coupled to the first ring oscillator, wherein an output of the first ring oscillator is coupled to a set input of the first flip-flop;
  a first non-overlapping clock generator electrically coupled to an output of the first flip-flop; and
  at least one first gate driver configured to generate a phase output signal, wherein the at least one first gate driver is electrically coupled to an output of the first non-overlapping clock generator; and
a low-frequency path comprising:
  a second ring oscillator;
  a second flip-flop electrically coupled to the second ring oscillator, wherein an output of the second ring oscillator is coupled to a set input of the second flip-flop;
  a second non-overlapping clock generator electrically coupled to an output of the second flip-flop; and
  at least one second gate driver configured to generate a phase output signal, wherein the at least one second gate driver is electrically coupled to an output of the second non-overlapping clock generator.

11. The ADPLL of claim 10, wherein the TDC is configured to generate a signal indicative of a phase difference between the phase-corrected clock signal and a reference signal.

12. The ADPLL of claim 10, wherein the doubler is configured to receive a TDC tuning word (TTW) from the TDC, and wherein the TDC generates the TTW based on a detected error between the second voltage signal and a target voltage.

13. The ADPLL of claim 12, wherein the doubler comprises a plurality of logic gates configured to decode the TTW.

14. The circuit of claim 10, wherein the at least one first gate driver is coupled to a first voltage doubling module and the at least one second gate driver is coupled to a second voltage doubling module.

15. A method of calibrating a time-to-digital convertor (TDC), comprising:
receiving a first voltage at an input of a doubler circuit;
selecting one of a high-frequency operation or a low-frequency operation of the doubler circuit by activating one of a first ring oscillator or a second ring oscillator;
generating a second voltage at an output of the doubler circuit, wherein the second voltage is greater than the first voltage, and wherein the output of the doubler circuit is coupled to an input of the TDC;
generating a TDC tuning word (TTW), wherein the TTW is provided to the doubler circuit; and
adjusting the second voltage based on the TTW.

16. The method of claim 15, wherein the TTW is generated based on a detected error between the second voltage and a target voltage.

17. The method of claim 15, wherein the second voltage is substantially equal to twice the first voltage.

* * * * *